US007911867B2

(12) United States Patent
Lee

(10) Patent No.: US 7,911,867 B2
(45) Date of Patent: Mar. 22, 2011

(54) SEMICONDUCTOR MEMORY DEVICE CAPABLE OF PERFORMING PER-BANK REFRESH

(75) Inventor: Sang Kwon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 292 days.

(21) Appl. No.: 12/215,457

(22) Filed: Jun. 27, 2008

(65) Prior Publication Data

US 2009/0116326 A1 May 7, 2009

(30) Foreign Application Priority Data

Nov. 2, 2007 (KR) ........................ 10-2007-0111518

(51) Int. Cl.
*G11C 8/04* (2006.01)
*G11C 7/22* (2006.01)

(52) U.S. Cl. .................... 365/222; 365/236; 365/230.03

(58) Field of Classification Search .................. 365/149, 365/222, 236, 230.03, 189.04
See application file for complete search history.

(56) References Cited

U.S. PATENT DOCUMENTS 5,477,491 A * 12/1995 Shirai .......................... 365/194
5,796,669 A 8/1998 Araki et al.
6,134,168 A 10/2000 Harrington et al.
6,215,714 B1 * 4/2001 Takemae et al. .............. 365/222
6,233,195 B1 * 5/2001 Yamazaki et al. ....... 365/230.03
6,646,942 B2 * 11/2003 Janzen ......................... 365/222
6,728,157 B2 * 4/2004 Yagishita et al. ............ 365/222
7,142,476 B2 11/2006 Hashimoto et al.
2005/0105362 A1 * 5/2005 Choi et al. .................... 365/222
2006/0221744 A1 * 10/2006 Lee .............................. 365/222
2007/0121409 A1 * 5/2007 Remaklus Jr. et al. ........ 365/222
2008/0049532 A1 * 2/2008 Kajigaya ...................... 365/222

FOREIGN PATENT DOCUMENTS

KR 10-2002-0085758 A 11/2002
KR 10-2005-0046427 A 5/2005
KR 10-2007-0115260 A 12/2007

* cited by examiner

*Primary Examiner* — VanThu Nguyen
*Assistant Examiner* — Douglas King
(74) *Attorney, Agent, or Firm* — John P. White; Cooper & Dunham LLP

(57) ABSTRACT

A semiconductor memory device is provided that can support a per-bank refresh as well as an all-bank refresh and a self refresh. The semiconductor memory device includes an address counting unit for counting a bank address signal of a specific bank and row address signals of the specific bank in response to a control signal including refresh mode information when a per-bank refresh command is received, and for counting row address signals in response to the control signal when an all-bank refresh command or a self refresh command is received.

21 Claims, 9 Drawing Sheets

SEMICONDUCTOR MEMORY DEVICE CAPABLE OF PERFORMING PER-BANK REFRESH

TECHNICAL FIELD

The present disclosure relates to a semiconductor memory device and, more particularly, to a semiconductor memory device with an address counter capable of supporting an execution of a refresh.

BACKGROUND

Generally, a semiconductor memory device has a row address counter capable of supporting auto bank refresh operation and a self refresh operation.

FIG. 1 is a circuit diagram illustrating a conventional address counter, FIG. 2 is a circuit diagram illustrating a clock generator in FIG. 1, FIG. 3 is a circuit diagram illustrating a T-flip flop in FIG. 1, and FIG. 4 is a timing chart illustrating the detailed operation of the address counter circuit in FIG. 1.

The address counter in FIG. 1 which is an N-bit address counter has a clock generator and N numbers of negative edge triggered T-flip flops Hereinafter, the detailed operation of the conventional address counter will be illustrated referring to the accompanying drawings.

When a self refresh request signal SREFREQP, which is internally generated within a DRAM, or an auto-refresh command from an external circuit is toggled to a high level, a clock signal REF_CLK is outputted with a constant delay width by the clock generator of FIG. 2.

This clock signal REF_CLK is inputted into a row address counter and N numbers of row address signals are then outputted therefrom.

As shown in FIG. 4, whenever the clock signal REF_CLK is toggled, the row address signals are sequentially increased.

However, this conventional address counter makes it difficult to implement a per-bank refresh. In the per-bank refresh operation, the refresh operation is carried out for only one bank instead of all the banks and typical read or write operations are carried out in other banks while such a specific bank is refreshed by the per-bank refresh command.

In order to implement the per-bank refresh only upon the specific bank, the bank address should be sequentially and internally counted based on a round-robin manner.

However, since the conventional address counter circuit has no a bank address counter and does not have a configuration capable of controlling the address count based on whether the refresh is in the per-bank refresh mode, the all-bank refresh mode or the self refresh mode, the per-bank refresh is not supported in the conventional address counter circuit.

BRIEF SUMMARY

The present disclosure is directed to providing a semiconductor memory device with an address counter circuit capable of supporting a per-bank refresh as well as an all-bank refresh and a self refresh.

According to an aspect of the present disclosure, there is provided a semiconductor memory device comprising an address counting unit configured to count a bank address signal of a specific bank and row address signals of the specific bank in response to a control signal including refresh mode information when a per-bank refresh command is received, and count row address signals in response to the control signal when an all-bank refresh command or a self refresh command is received.

According to another aspect of the present invention, there is provided a semiconductor memory device comprising an address counting unit configured to output a bank address signal of a specific bank and row address signals of the specific bank in response to a control signal including refresh mode information when a per-bank refresh command is received, and count row address signals in response to the control signal when an all-bank refresh command or a self refresh command is received; a reset signal generating unit configured to output a reset signal to the address counting unit when an all-bank refresh command or a self refresh command is received, a refresh flag signal generating unit configured to output a first flag signal when the per-bank refresh command is received, and outputting a second flag signal when the all-bank refresh command or the self refresh command is received, and a refresh select control unit configured to output the control signal in response to the second flag signal when the all-bank refresh command or the self refresh command, and output the control signal in response to the first flag signal and the bank address signal when the per-bank refresh command is received.

According to another aspect of the present invention, there is provided a semiconductor memory device comprising a bank address counting unit configured to output a bank address signal of a specific bank in response to a first pulse signal corresponding to a per-bank refresh command, a refresh select control unit configured to output a control signal in response to flag signals including refresh mode information and a second pulse signal corresponding to the all-bank refresh command or the self refresh command, and output the control signal in response to the flag signals and the bank address signal, and a row address counting unit configured to output row address signals in response to the control signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, the present invention will be described through embodiments. The examples and exemplary embodiments merely exemplify the present invention, and the scope of the present disclosure and the appended claims is not limited by them.

Figure 1:
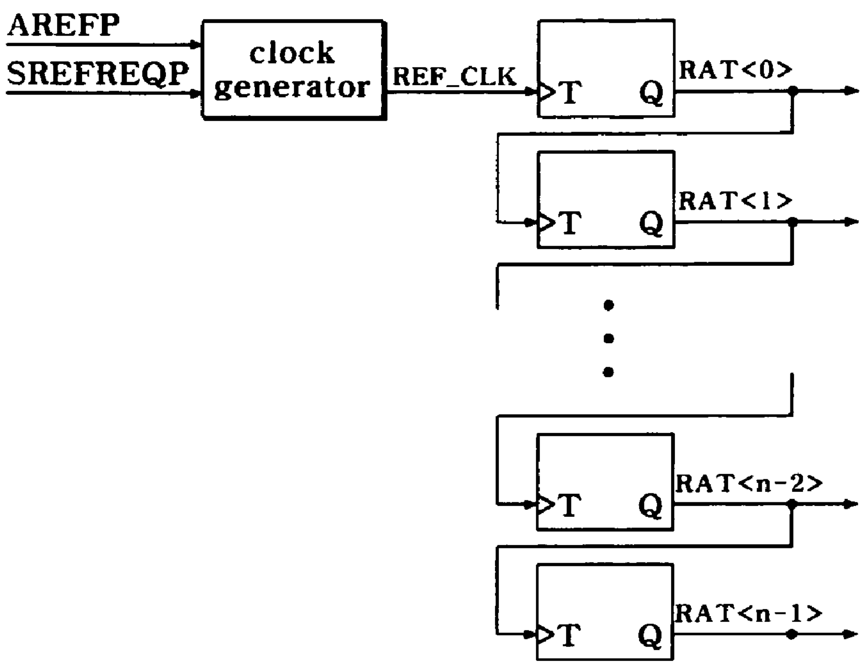
FIG. 1 is a circuit diagram illustrating a conventional address counter.
Figure 2:
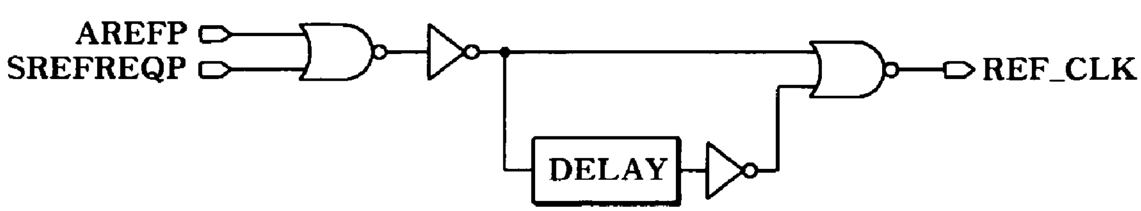
FIG. 2 is a circuit diagram illustrating a clock generator shown in FIG. 1.
Figure 3:
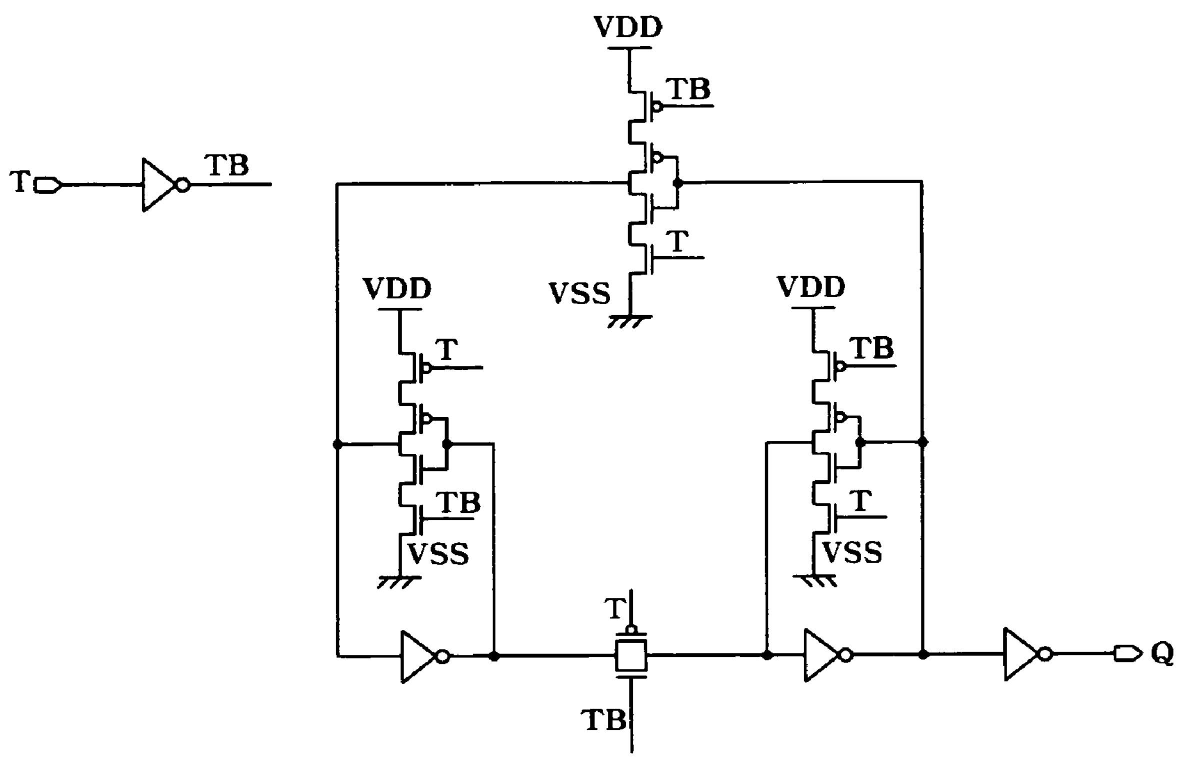
FIG. 3 is a circuit diagram illustrating a T-flip flop shown in FIG. 1.
Figure 4:
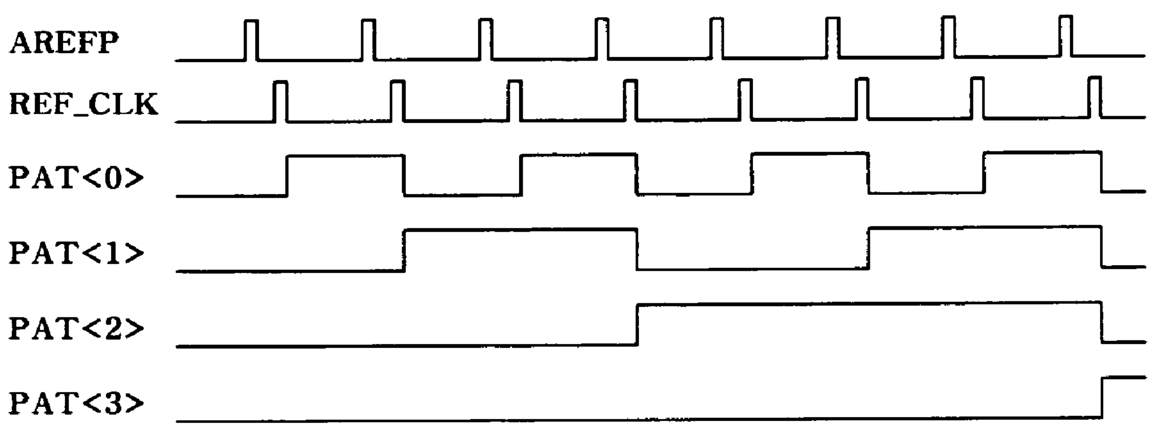
FIG. 4 is a timing chart illustrating the detailed operation of the address counter circuit shown in FIG. 1.
Figure 5:
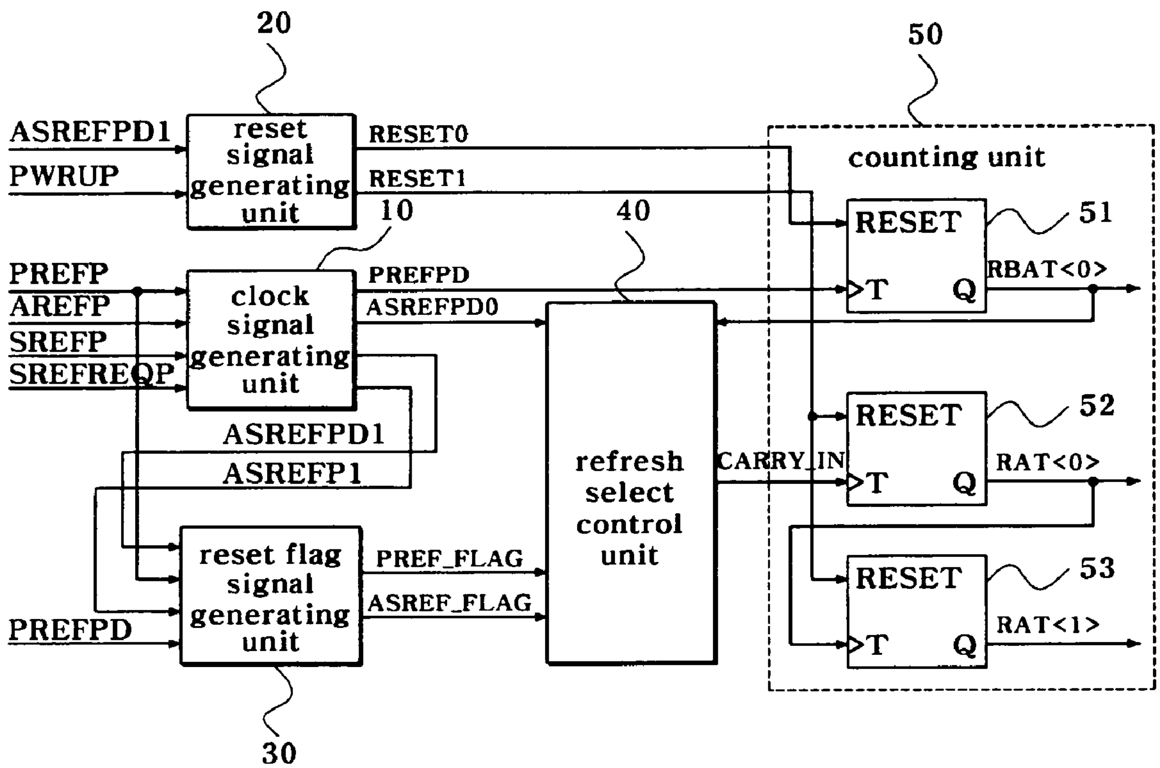
FIG. 5 is a circuit diagram illustrating an address counter circuit according to an embodiment of the present disclosure.

An address counter circuit according to an embodiment of the present disclosure is exemplarily shown in FIG. 5, using one bank address signal and two row address signals.

Referring to FIG. 5, the address counter circuit according to the embodiment includes a clock signal generating unit 10, a reset signal generating unit 20, a refresh flag signal generating unit 30, a refresh select control unit 40 and a counting unit 50. First, the counting unit 50 outputs a specific bank address signal RBAT<0> and row address signals RAT<0> and RAT<1> in response to a pulse signal PREFPD (referred to as "fifth pulse signal"), which is generated corresponding to a per-bank refresh command PREFP (occasionally, referred to as "first pulse signal"), and a control signal CARRY_IN including refresh information.

The reset signal generating unit 20 outputs reset signals RESET0 and RESET1 to the counting unit 50 in response to a power-up signal PWRUP or a pulse signal ASREFPD1. The pulse signal ASREFPD1 (referred to as "seventh pulse signal") is generated when an all-bank refresh command AREFP (referred to as "second pulse signal") or a self refresh command SREFP (referred to as "third pulse signal") is received.

The refresh flag signal generating unit 30 outputs first and second flag signals PREF_FLAG and ASREF_FLAG in response to pulse signal PREFPD (referred to as "fifth pulse signal"), which is issued in response to the per-bank refresh command PREFP, and the seventh and eight pulse signals ASREFPD1 and ASREFP1, which are issued in response to the all-bank refresh command AREFP or the self refresh command SREFP.

The refresh select control unit 40 outputs a control signal CARRY_IN in response to a bank address signal RBAT<0>, the first and second flag signals PREF_FLAG and ASREF_FLAG, a sixth pulse signal ASREFPD0, which is issued in response to the all-bank refresh command AREFP or the self refresh command. In particular, the control signal CARRY_IN is generated in response to the sixth pulse signal ASREFPD0 and the second flag signal ASREF_FLAG or in response to the first flag signal PREF_FLAG and the bank address signal RBAT<0>.

The clock signal generating unit 10 outputs a plurality of the pulse signals PREFPD, ASREFPD0, ASREFPD1 and ASREFP1 in response to a per-bank refresh command PREFP, the all-bank refresh command AREFP and the self refresh command SREFP and a self refresh request command SREFREQP.

Figure 6:
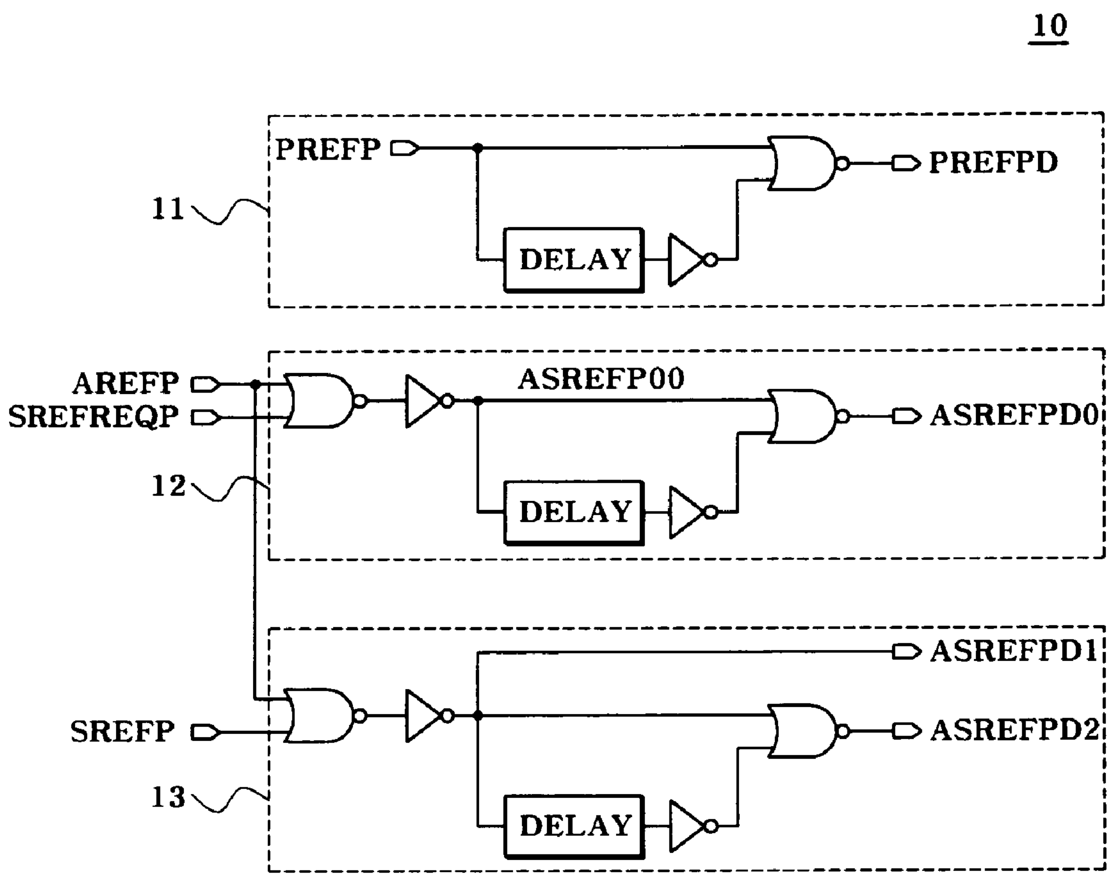
FIG. 6 is a circuit diagram illustrating a clock signal generating unit shown in FIG. 5.

Referring to FIG. 6, the clock signal generating unit 10 includes a first delayer 11 for outputting the fifth pulse signal PREFPD by delaying the first pulse signal PREFP of the per-bank refresh command for a predetermined time, a second delayer 12 for outputting the sixth pulse signal ASREFPD0 by delaying a logic signal which is generated by performing an OR operation of the second pulse signal AREFP and a fourth pulse signal SREFREQP (self refresh request signal), and a third delayer 13 for generating the eight pulse signal ASREFP1 by performing an OR operation of the second pulse signal AREFP and the third pulse signal SREFP and generating the seventh pulse signal ASREFPD1 by delaying the eight pulse signal ASREFP1 for a predetermined time.

Figure 7:
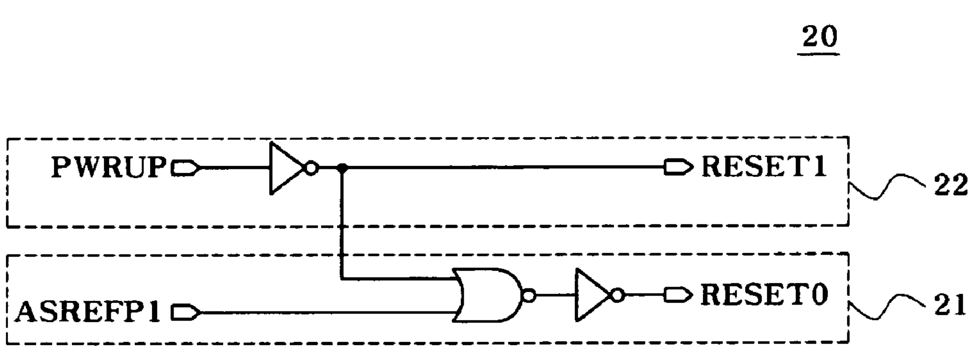
FIG. 7 is a circuit diagram illustrating a reset signal generating unit shown in FIG. 5.

Referring to FIG. 7, the reset signal generating unit 20 includes a first reset signal generating unit 21 for outputting the first reset signal RESET0 by performing an OR operation of the seventh pulse signal ASREFP1 and an inverted signal of the power-up signal PWRUP, and a second reset signal generating unit 22 for outputting the second reset signal RESET1 by inverting the power-up signal PWRUP.

That is, the first reset signal generating unit 21 outputs the first reset signal RESET0 when any one of the power-up signal PWRUP, the all-bank refresh command and the self refresh command is activated and the second reset signal generating unit 22 outputs the second reset signal RESET1 whenever the power-up signal PWRUP is activated.

Figure 8:
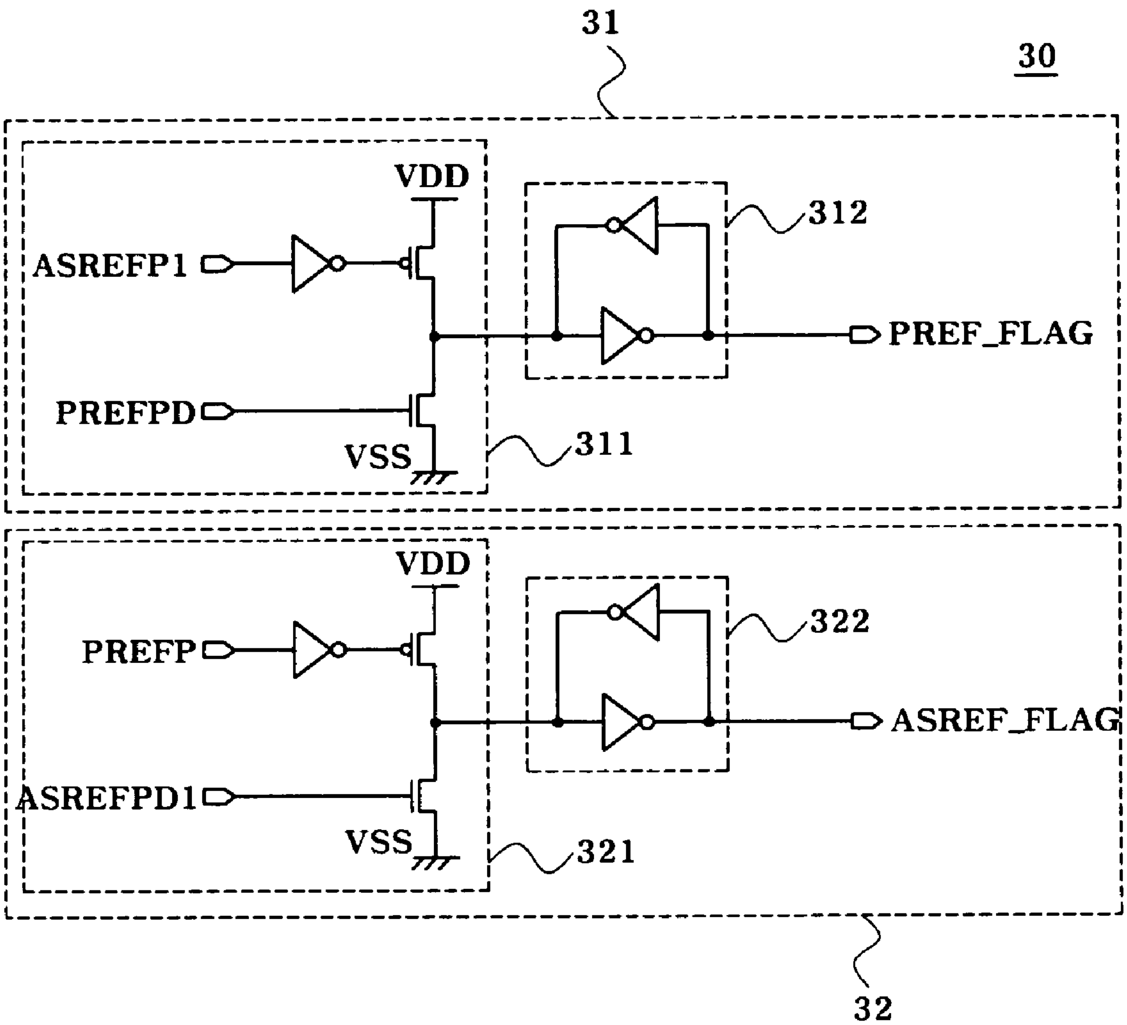
FIG. 8 is a circuit diagram illustrating a refresh flag signal generating unit in FIG. 5.

Referring to FIG. 8, the refresh flag signal generating unit 30 includes a first flag signal generating unit 31 for generating a first flag signal PREF_FLAG in response to the fifth pulse signal PREFPD and the eight pulse signal ASREFP1 and a second flag signal generating unit 32 for generating a second flag signal ASREF_FLAG in response to the first pulse signal PREFP and the seventh pulse signal ASREFPD1.

The first flag signal generating unit 31 includes a first driving unit 311 for performing a pull-down operation in response to the fifth pulse signal PREFPD and performing a pull-up operation in response to an inverted signal of the eight pulse signal ASREFP1 and a first latch unit 312 for latching an output signal of the first driving unit 311.

The second flag signal generating unit 32 includes a second driving unit 321 for performing a pull-down operation in response to the seventh pulse signal ASREFPD1 and performing a pull-up operation in response to an inverted signal of the first pulse signal PREFP and a second latch unit 322 for latching an output signal of the second driving unit 321.

That is, the first flag signal generating unit 31 outputs the first flag signal PREF_FLAG which is activated when a per-bank refresh command is inputted and the second flag signal generating unit 32 outputs the second flag signal ASREF_FLAG which is activated when the all-bank refresh command or the self refresh command is inputted.

Figure 9:
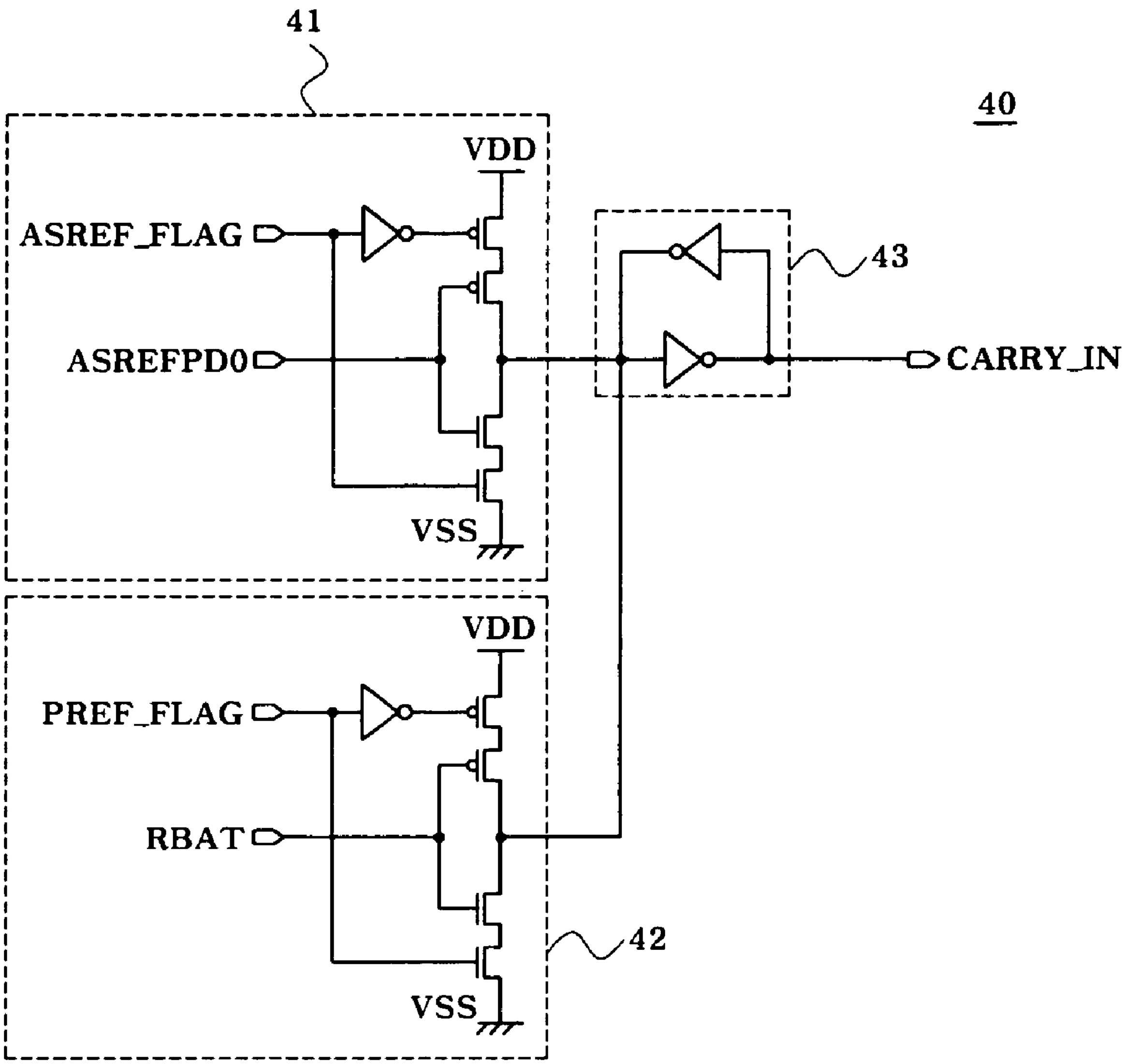
FIG. 9 is a circuit diagram illustrating a refresh select control unit in FIG. 5.

Referring to FIG. 9, the refresh select control unit 40 includes a first controller 41 which is enabled by the second flag signal ASREF_FLAG and driven in response to the sixth pulse signal ASREFPD0, a second controller 42 which is enabled by the first flag signal PREF_FLAG and driven in response to the bank address signal RBAT<0>, and a latch unit 43 for latching an output signal of each of the first and second controllers 41 and 42.

That is, the refresh select control unit 40 outputs the control signal CARRY_IN in response to the bank address signal RBAT<0> when the per-bank address command is inputted or outputs the control signal CARRY_IN in response to the sixth pulse signal ASREFPD0, which is issued when the all-bank refresh command or the self refresh command is inputted.

Figure 10:
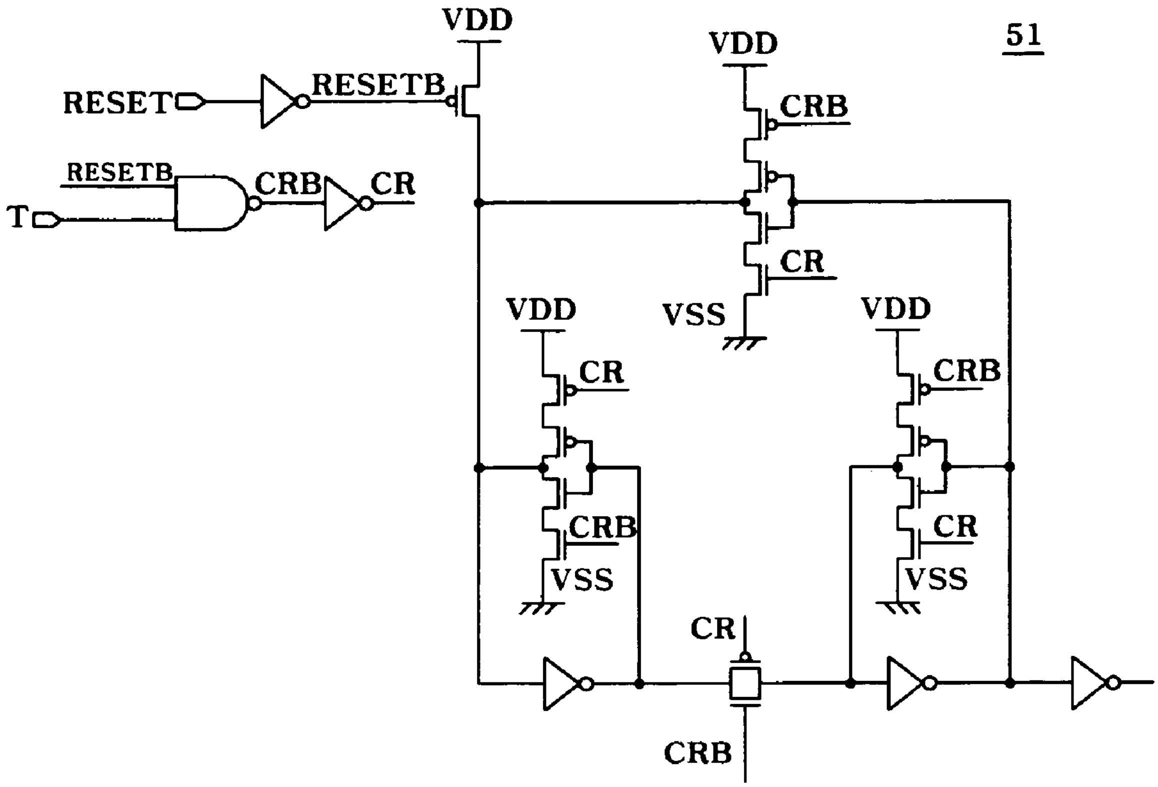
FIG. 10 is a circuit diagram illustrating a T-flip flop included in a counting unit of FIG. 5.
Figure 11:
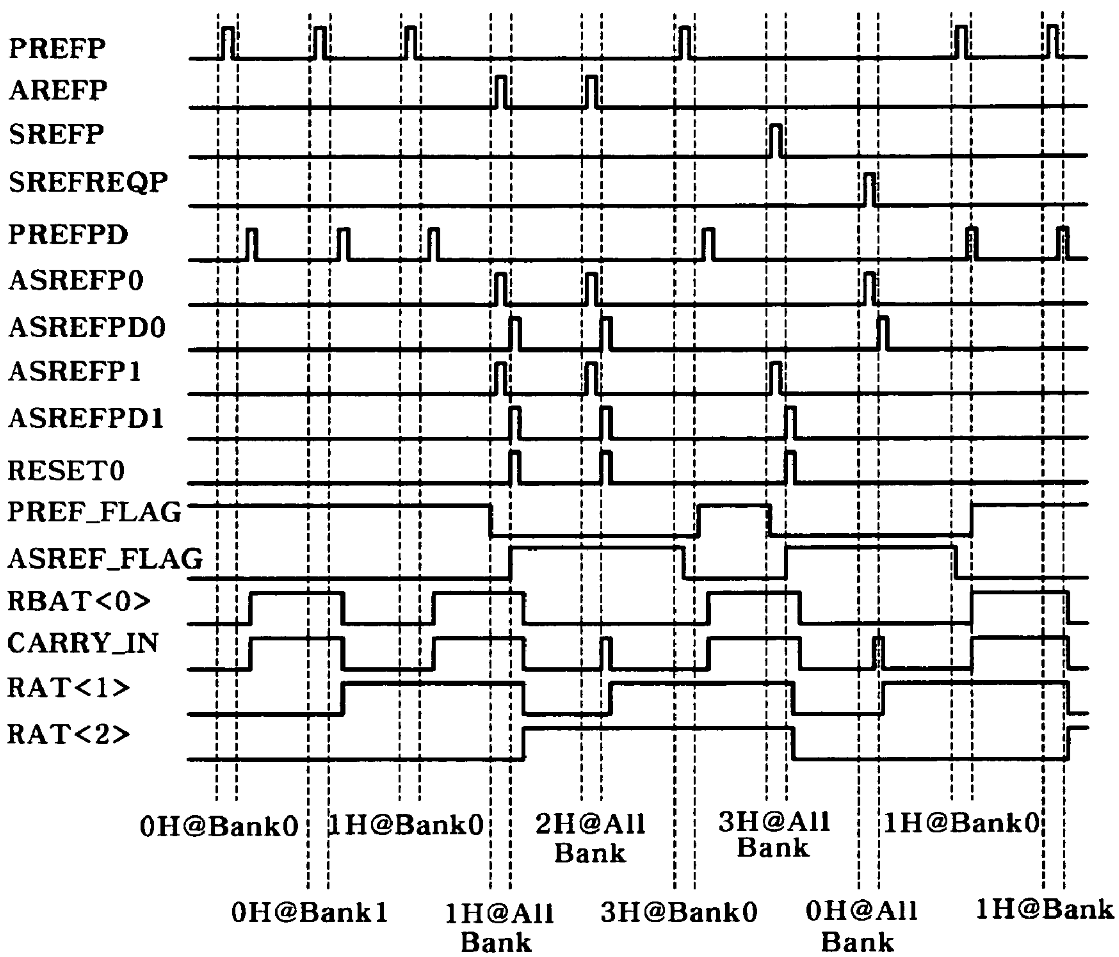
FIG. 11 is a timing chart illustrating the detailed operation of the address counter circuit in FIG. 5.

FIG. 10 is a circuit diagram illustrating a T-flip flop included in a counting unit of FIG. 5. The counting unit 50 includes a bank address counter 51 which is reset in response to the first reset signal RESET0 and counts the bank address signal RBAT<0> in response to the fifth pulse signal PREFPD and a row address counter 52 which is reset in response to the second reset signal RESET1 and counts row address signals RAT<0:1> in response to the control signal CARRY_IN. Also, as shown in FIG. 10, the bank address counter 51 and the row address counter 52 is implemented by the T-flip flop.

Referring to FIGS. 5 to 11, the address counting circuit according to an example of the present invention will be described below.

First, when a per-bank refresh command PREFP is inputted, the clock signal generating unit 10 outputs the fifth pulse signal PREFPD. The bank address counter 51 outputs the bank address signal RBAT<0> in response to the fifth pulse signal PREFPD. The second controller 42 of the refresh select control unit 40 outputs the control signal CARRY_IN in response to the bank address signal RBAT<0> and the first flag signal PREF_FLAG from the bank address counter 51.

The row address counter 52 gradually increases the row address signals RAT<0> and RAT<1> in response to the bank address signal RBAT<0>. At this time, if the all-bank refresh command AREFP or the self refresh command SREFP is inputted, the clock signal generating unit 10 outputs the sixth to eight pulse signals ASREFPD0, ASREFP1 and ASREFPD1.

The reset signal generating unit 20 outputs the first reset signal RESET0 in response to the seventh pulse signal ASREFPD1. The bank address counter 51 is reset in response to the first reset signal RESET0. The refresh select control unit 40 outputs the control signal CARRY_IN in response to the second flag signal ASREF_FLAG and the sixth pulse signal ASREFPD0. The row address counter 52 gradually increases only the row address signals RAT<0> and RAT<1> in response to the sixth pulse signal ASREFPD0.

As mentioned above, the refresh select control unit 40 controls whether the counting unit 50 performs the counting operation based on a per-bank refresh command or based on the all-bank or self refresh command. That is, in case of the per-bank refresh mode, the bank address signal RBAT<0> is inputted into the row address counter 52 and, in case of the all-bank refresh or the self refresh mode, the sixth pulse signal ASREFPD0 is inputted into the row address counter 52. Therefore, when the all-bank refresh command is inputted or a self refresh request is internally issued, the bank address signal is not increased and only the row address signals are gradually increased.

As apparent from the above, the present invention can support a per-bank refresh as well as the all-bank refresh and the self refresh.

While the present invention has been described with respect to embodiments, it will be apparent to those skilled in the art that various changes and modifications may be made without departing from the spirit and scope of the disclosure and the following claims.

The present disclosure claims priority to Korean application number 10-2007-0111518, filed on Nov. 2, 2007, the entire contents of which are incorporated herein by reference.

What is claimed is:

1. A semiconductor memory device comprising:

an address counting unit configured to output a bank address signal of a specific bank and row address signals of the specific bank in response to a control signal including refresh mode information when a per-bank refresh command is received, and count row address signals in response to the control signal when an all-bank refresh command or a self refresh command is received;

a first reset signal generating unit configured to output a first reset signal to the address counting unit when any one of a power-up signal, the all-bank refresh command and the self refresh command is activated; and a second reset signal generating unit configured to output a second reset signal to the address counting unit when the power-up signal is activated.

2. The semiconductor memory device of claim 1, further comprising a refresh select control unit configured to output the control signal in response to the bank address signal of the specific bank when the per-bank refresh command is received, and output the control signal in response to the all-bank refresh command or the self refresh command, when the all-bank refresh command or the self refresh command is received.

3. The semiconductor memory device of claim 2, wherein the refresh select control unit includes:

a first controller configured to output the control signal in response to the bank address signal when the per-bank refresh command is received;

a second controller configured to output the control signal in response to the all-bank refresh command or the self refresh command when the all-bank refresh command or the self refresh command is received; and a latch unit configured to latch the control signal.

4. The semiconductor memory device of claim 1, wherein the address counting unit includes:

a bank address counter configured to output the bank address signal of the specific bank when the per-bank refresh command is received; and a plurality of row address counters configured to output row address signals when the per-bank refresh command or the all-bank refresh command or the self refresh command is received.

5. The semiconductor memory device of claim 4, wherein the bank address counter is reset, when the all-bank refresh command or the self refresh command is activated, and wherein the row address counters output the row address signals.

6. The semiconductor memory device of claim 4, wherein the bank address counter and each row address counter include T-flip flops, respectively.

7. A semiconductor memory device comprising:

an address counting unit configured to output a bank address signal of a specific bank and row address signals of the specific bank in response to a control signal including refresh mode information when a per-bank refresh command is received, and count row address signals in response to the control signal when an all-bank refresh command or a self refresh command is received;

a first reset signal generating unit configured to output a first reset signal to the address counting unit when any one of a power-up signal, the all-bank refresh command and the self refresh command is activated;

a second reset signal generating unit configured to output a second reset signal to the address counting unit when the power-up signal is activated;

a refresh flag signal generating unit configured to output a first flag signal when the per-bank refresh command is received, and output a second flag signal when the all-bank refresh command or the self refresh command is received; and a refresh select control unit configured to output the control signal in response to the second flag signal when the all-bank refresh command or the self refresh command, and output the control signal in response to the first flag signal and the bank address signal when the per-bank refresh command is received.

8. The semiconductor memory device of claim 7, wherein the address counting unit outputs the bank address signal of the specific bank and row address signals of the specific bank when the per-bank refresh command is received.

9. The semiconductor memory device of claim 8, wherein the address counting unit outputs the row address signals when the all-bank refresh command or the self refresh command is received.

10. The semiconductor memory device of claim 7, further comprising a clock signal generating unit configured to output first to third pulse signals in response to the per-bank refresh command, the all-bank refresh command and the self refresh command.

11. The semiconductor memory device of claim 10, wherein the clock signal generating unit includes:

a first pulse generator configured to output the first pulse signal in response to the per-bank refresh command;

a second pulse generator configured to output the second pulse signal in response to a self refresh request signal and the all-bank refresh command; and a third pulse generator configured to generate the third pulse signal in response to the all-bank refresh command and the self refresh command.

12. The semiconductor memory device of claim 7, wherein the refresh flag signal generating unit includes:

a first refresh flag signal generating unit configured to output a first flag signal which is activated when the per-bank refresh command is received; and a second refresh flag signal generating unit configured to output a second flag signal which is activated when the all-bank refresh command or the self refresh command is received.

13. The semiconductor memory device of claim 7, wherein the refresh select control unit includes:

a first controller configured to output the control signal in response to the bank address signal when the per-bank refresh command is received;

a second controller configured to output the control signal in response to the all-bank refresh command or the self refresh command when the all-bank refresh command or the self refresh command is received; and a latch unit configured to latch the control signal.

14. The semiconductor memory device of claim 7, wherein the address counting unit includes:

a bank address counter configured to output the bank address signal of the specific bank and the row address signal of the specific bank when the per-bank refresh command is received; and a plurality of row address counters configured to output row address signals when the all-bank refresh command or the self refresh command is received is received.

15. The semiconductor memory device of claim 14, wherein the bank address counting unit is reset, when the all-bank refresh command or the self refresh command is activated, and wherein the row address counting unit outputs the row address signals.

16. A semiconductor memory device comprising:

a bank address counting unit configured to output a bank address signal of a specific bank in response to a first pulse signal corresponding to a per-bank refresh command;

a refresh select control unit configured to output a control signal in response to flag signals including refresh mode information and a second pulse signal corresponding to an all-bank refresh command or a self refresh command, and output the control signal in response to the flag signals and the bank address signal;

a row address counting unit configured to output row address signals in response to the control signal;

a first reset signal generating unit configured to output a first reset signal to the address counting unit and the row address counting unit when any one of a power-up signal, the all-bank refresh command and the self refresh command is activated; and a second reset signal generating unit configured to output a second reset signal to the address counting unit and the row address counting unit when the power-up signal is activated.

17. The semiconductor memory device of claim 16, further comprising a clock signal generating unit configured to output first to third pulse signals in response to the per-bank refresh command, the all-bank refresh command and the self refresh command, a self refresh request command.

18. The semiconductor memory device of claim 17, wherein the clock signal generating unit includes:

a first pulse generator configured to output the first pulse signal in response to the per-bank refresh command;

a second pulse generator configured to output the second pulse signal in response to the self refresh request signal and the all-bank refresh command; and a third pulse generator configured to generate the third pulse signal in response to the all-bank refresh command and the self refresh command.

19. The semiconductor memory device of claim 16, further comprising a refresh flag signal generating unit includes:

a first refresh flag signal generating unit configured to output a first flag signal which is activated when the per-bank refresh command is received; and a second refresh flag signal generating unit configured to output a second flag signal which is activated when the all-bank refresh command or the self refresh command is received.

20. The semiconductor memory device of claim 16, wherein the refresh select control unit includes:

a first controller configured to output the control signal in response to the bank address signal when the per-bank refresh command is received;

a second controller configured to output the control signal in response to the second pulse signal when the all-bank refresh command or the self refresh command is received; and a latch unit configured to latch the control signal.

21. The semiconductor memory device of claim 16, wherein the bank address counting unit is reset, when the all-bank refresh command or the self refresh command is activated, and wherein the row address counting unit outputs the row address signals.

* * * * *